United States Patent
Ben-Tzur et al.

(10) Patent No.: US 7,026,235 B1
(45) Date of Patent: Apr. 11, 2006

(54) DUAL-DAMASCENE PROCESS AND ASSOCIATED FLOATING METAL STRUCTURES

(75) Inventors: Mira Ben-Tzur, Sunnyvale, CA (US); Krishnaswamy Ramkumar, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 651 days.

(21) Appl. No.: 10/072,164

(22) Filed: Feb. 7, 2002

(51) Int. Cl.
*H01L 21/4763* (2006.01)

(52) U.S. Cl. .................................................. 438/619
(58) Field of Classification Search ................ 438/619
See application file for complete search history.

(56) References Cited

U.S. PATENT DOCUMENTS

| | | | |
|---|---|---|---|
| 4,190,488 A | 2/1980 | Winters | |
| 4,498,953 A | 2/1985 | Cook et al. | |
| 4,749,440 A | 6/1988 | Blackwood et al. | |
| 4,789,648 A | 12/1988 | Chow et al. | |
| 4,944,836 A | 7/1990 | Beyer et al. | |
| 4,956,313 A | 9/1990 | Cote et al. | |
| 5,030,319 A | 7/1991 | Nishino et al. | |
| 5,262,354 A | 11/1993 | Cote et al. | |
| 5,312,777 A | 5/1994 | Cronin et al. | |
| 5,354,416 A | 10/1994 | Okudaira et al. | |
| 5,397,741 A | 3/1995 | O'Connor et al. | |
| 5,453,639 A | 9/1995 | Cronin et al. | |
| 5,534,107 A | 7/1996 | Gray et al. | |
| 5,668,398 A | 9/1997 | Havemann et al. | |
| 5,676,587 A | 10/1997 | Landers et al. | |
| 5,716,495 A | 2/1998 | Butterbaugh et al. | |
| 5,726,480 A | 3/1998 | Pister | |
| 5,918,149 A | 6/1999 | Besser et al. | |
| 5,963,830 A | 10/1999 | Wang et al. | |
| 6,015,599 A | 1/2000 | Keller et al. | |
| 6,117,748 A | 9/2000 | Lou et al. | |
| 6,120,844 A | 9/2000 | Chen et al. | |
| 6,197,610 B1 | 3/2001 | Toda | |
| 6,204,200 B1 | 3/2001 | Shieh et al. | |
| 6,254,792 B1 | 7/2001 | Van Buskirk et al. | |
| 6,271,145 B1 | 8/2001 | Toda | |
| 6,290,864 B1 | 9/2001 | Patel et al. | |
| 6,331,459 B1 | 12/2001 | Gruening | |
| 6,355,498 B1 * | 3/2002 | Chan et al. | 438/48 |
| 6,372,632 B1 | 4/2002 | Yu et al. | |
| 6,413,852 B1 * | 7/2002 | Grill et al. | 438/619 |
| 6,436,787 B1 | 8/2002 | Shih et al. | |

(Continued)

OTHER PUBLICATIONS

H.F. Winters and J. W. Coburn, The etching of silicon with XeF2 vapor, Appl. Phys. Lett. Jan. 1979, pp. 70-73, vol. 34, No. 1, IBM Research Lab, San Jose, California, USA.

(Continued)

*Primary Examiner*—Evan Pert
*Assistant Examiner*—Victor A. Mandala, Jr.
(74) *Attorney, Agent, or Firm*—Okamoto & Benedicto LLP

(57) ABSTRACT

In one embodiment, an interconnect line on one level of an integrated circuit is electrically coupled to another interconnect line on another level. The two layers of interconnects may be coupled together using a via. To reduce capacitance between the interconnect lines, an air core is formed between them. The air core may be formed by using a chemistry that includes a noble gas fluoride to etch a sacrificial layer between the interconnect layers.

16 Claims, 8 Drawing Sheets

U.S. PATENT DOCUMENTS

| | | | |
|---|---|---|---|
| 6,461,888 | B1 | 10/2002 | Sridhar et al. |
| 6,496,348 | B1 | 12/2002 | McIntosh |
| 6,531,331 | B1 | 3/2003 | Bennett et al. |
| 6,555,467 | B1 * | 4/2003 | Hsu et al. .................. 438/633 |
| 2003/0036215 | A1 | 2/2003 | Reid |
| 2003/0054588 | A1 | 3/2003 | Patel et al. |
| 2003/0073302 | A1 * | 4/2003 | Huibers ...................... 438/622 |

OTHER PUBLICATIONS

V.S. Aliev and V.N. Kruchinin, Development of Si (100) surface roughness at the intial stage of etching in F2 and XeF2 gases: ellipsometric study, Surface Science 442 (1999) pp. 206-214, Elsevier Science, Novosibirsk, Russia.

F.A. Houle, Dynamics of SiF4 desorption during etching of silicon by XeF2, J. Chem. Phys. Aug. 1987, pp. 1866-1872, vol. 87, No. 3, IBM Research Center, San Jose, California, USA.

D.E. Ibbotson, J.A. Mucha, and D.L. Flamm, J.M. Cook, Plasmaless dry etching of silicon with fluorine-containing compounds, J. Appl. Phys., Nov. 15, 1984, pp. 2939-2942, vol. 56, No. 10, AT&T Bell Laboratories, Murray Hill, New Jersey, and Allentown, Pennsylvania, USA.

Dale E. Ibbotson, Daniel L. Flamm, John A. Mucha, and Vincent M. Donnelly, Comparison of XeF2 and F-atom reactions with Si and SiO2, Appl. Phys. Lett. Jun. 15, 1984, pp. 1129-1131, vol. 44, No. 12, AT&T Bell Laboratories, Murray Hill, New Jersey, USA.

Chung-Hui Chen, Yean-Kuen Fang, Chih-Wei Yang, and C.S. Tang, A Deep Submicron CMOS Process Compatible Susupending High-Q Inductor, IEEE Electron Device Letters, Nov. 11, 2001, pp. 522-523, vol. 22, No. 11, Taiwan R.O.C.

Thomas E. Wade, Gas Dome System, Provides Unity-K Dielectric, Semiconductor International, pp. 125, 126,128, 130, and 133, University of South Florida, Tampa, Florida, USA.

Karl Bohringer, EE 539 Autumm 1999, Slide 1-14 [retrieved on Nov. 20, 2001]. Retrieved from the internet: <URL:http//www.ee.washington.edu/class/539/Lectures/lecture3/sld001-014.html>.

Seong Geon Park, et al. "A New ALD-TiN/CoSi2 Contact Plug Process for Reliable and Low Defect Density Bit-Line Integration in Sub-Quarter Micron Giga-bit DRAM" pp. 282-284, Semiconductor R&D Center, Samsung Electronics Co. LTD., Korea.

* cited by examiner

DUAL-DAMASCENE PROCESS AND ASSOCIATED FLOATING METAL STRUCTURES

BACKGROUND OF THE INVENTION

1. Field of the Invention

The present invention relates generally to integrated circuits, and more particularly to integrated circuit structures and fabrication processes.

2. Description of the Background Art

An integrated circuit typically includes multiple sections for performing various functions. The sections may be on one level of an integrated circuit, or in separate levels. A conductive line, commonly referred to as an interconnect line, electrically couples two or more sections that are on the same level of the integrated circuit. To couple sections that are on different levels, a via is provided between the levels. The via is filled with a conductive material. One end of the via is coupled to an interconnect line on an upper level, while the other end of the via is coupled to an interconnect line on a lower level. A dielectric layer is provided between levels for electrical isolation.

The speed at which a signal is propagated in an integrated circuit is limited by the delay through the interconnect line carrying the signal. This delay, commonly referred to as "RC delay," is due to the resistance and capacitance of the interconnect line. Reducing the resistance or capacitance of the interconnect line lowers its RC delay and increases signal propagation speed. Thus, reducing the RC delay of interconnect lines plays a major role in making integrated circuits run faster.

Using a low-resistance interconnect material such as copper helps lower the resulting RC delay. To reduce capacitance, a dielectric material having a low dielectric constant, referred to as a low-k dielectric, may be used between interconnect lines or layers.

A low-k dielectric region may be formed by using a TEOS oxide to fill gaps between metal lines. The inability of the TEOS oxide to completely fill the gaps results in air gaps between the metal lines. Because air has a dielectric constant of 1, the resulting air gaps help lower capacitance. However, the formation of the resulting air gaps is not controllable, and their size varies depending on the metal etch profile and available space. Additionally, the TEOS oxide fills the space between metal layers. Various relatively complicated unity-k dielectric structures have also been proposed to lower capacitance on metal lines.

SUMMARY

The present invention relates to a dual-damascene process for forming a floating metal structure. The invention may be used in a variety of applications including in the formation of interconnect lines, for example.

In one embodiment, an interconnect line on one level of an integrated circuit is electrically coupled to another interconnect line on another level. The two layers of interconnects may be coupled together using a via. To reduce capacitance between the interconnect lines, an air core is formed between them. The air core may be formed by using a chemistry that includes a noble gas fluoride to etch a sacrificial layer between the interconnect layers.

In one embodiment, the sacrificial layer includes a silicon material such as polycrystalline silicon or amorphous silicon, while the noble gas fluoride includes xenon difluoride.

These and other features and advantages of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of materials, thicknesses, steps, and structures to provide a thorough understanding of embodiments of the invention. Persons of ordinary skill in the art will recognize, however, that the invention may be practiced without one or more of the specific details, or with other materials, thicknesses, steps, and structures. In other instances, well-known details are not shown or described to avoid obscuring aspects of the invention. For example, masking steps and seed layers are not shown or described for clarity of illustration.

It is to be noted that as used in the present disclosure, the terms "overlying" and "underlying" refer to the relative placement of two layers that may or may not be directly in contact with each other; that is, the two layers may be separated by another layer. Additionally, the term "sample" is used in the present disclosure to refer to an article on which one or more integrated circuit levels are formed. A sample may be a wafer or a substrate, for example.

The present invention relates to dual-damascene processes and floating metal structures. A floating metal structure is also disclosed in commonly-assigned U.S. application Ser. No. 10/059,823, entitled "METHOD OF FORMING A FLOATING METAL STRUCTURE IN AN INTEGRATED CIRCUIT", filed on Jan. 29, 2002, by Mira Ben-Tzur, Krishnaswamy Ramkumar, James Hunter, T. J. Rodgers, Mike Bruner, and Kiyoko Ikeuchi. The just mentioned U.S. application is incorporated herein by reference in its entirety.

Figure 1A:
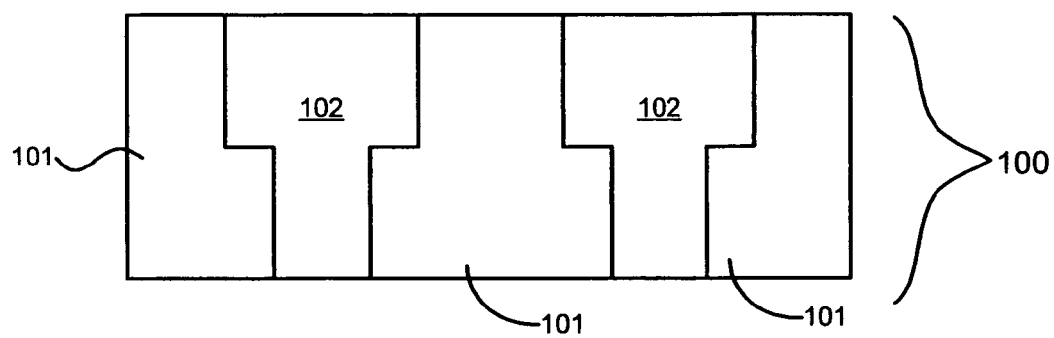
FIGS. 1A–1M show sectional views schematically illustrating a dual-damascene process in accordance with an embodiment of the present invention.

A dual-damascene process in accordance with an embodiment of the present invention is now described with reference to the sectional views of FIGS. 1A–1M. Referring to FIG. 1A, there is shown a metallization level 100 on which a metallization level according to an embodiment of the present invention may be formed. It is to be understood, however, that metallization level 100 is being provided herein only for illustration purposes; metallization levels according to embodiments of the present invention may be employed as a first, last, or intervening metallization level.

Metallization level 100 includes metal structures 102. Metal structures 102 may be formed using a damascene, dual-damascene, or other metallization process. Metal structures 102 may be made of copper or aluminum, for example. Dielectrics 101 electrically isolate one metal structure 102 from another. Dielectrics 101 may be of TEOS or other low-k dielectric material, for example.

Figure 1B:
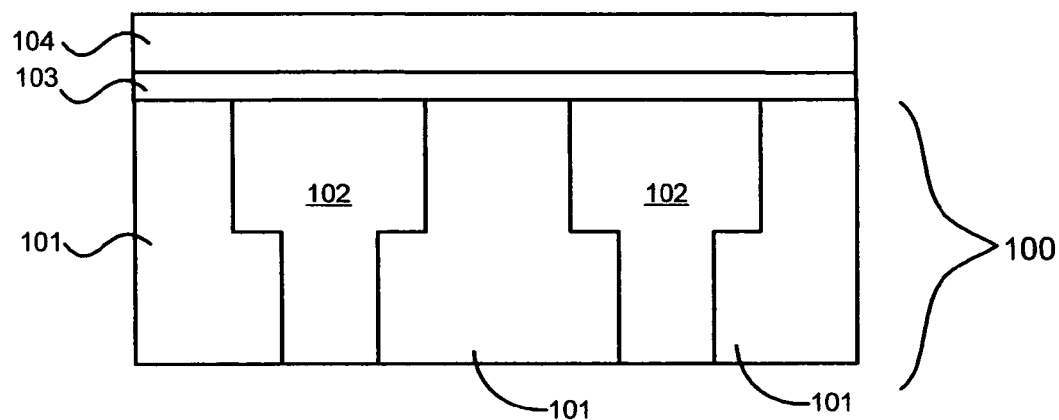

In FIG. 1B, a capping layer 103 is deposited overlying metallization level 100. Capping layer 103 separates metallization level 100 from an overlying metallization level; capping layer 103 may also function as a barrier layer for minimizing metal diffusion. For example, capping layer 103 may be of silicon nitride ($Si_3N_4$) deposited to a thickness of 500 Angstroms by plasma enhanced chemical vapor deposition (PECVD). Other non-conductive materials may also be used instead of silicon nitride. For example, silicon carbide or silicon nitride carbide may also be used as a capping layer 103.

Still referring to FIG. 1B, a support layer 104 is deposited overlying capping layer 103. Support layer 104 provides structural support to a subsequently formed floating metal structure overlying metallization level 100. In one embodiment, the floating metal structure includes a via and an interconnect line; the via is formed through support layer 104 in that embodiment. Support layer 104 may be a silicon dioxide layer ($SiO_2$) deposited to a thickness of 3000 Angstroms by PECVD, for example. Advantageously, support layer 104 is of a low-k dielectric material.

Figure 1C:
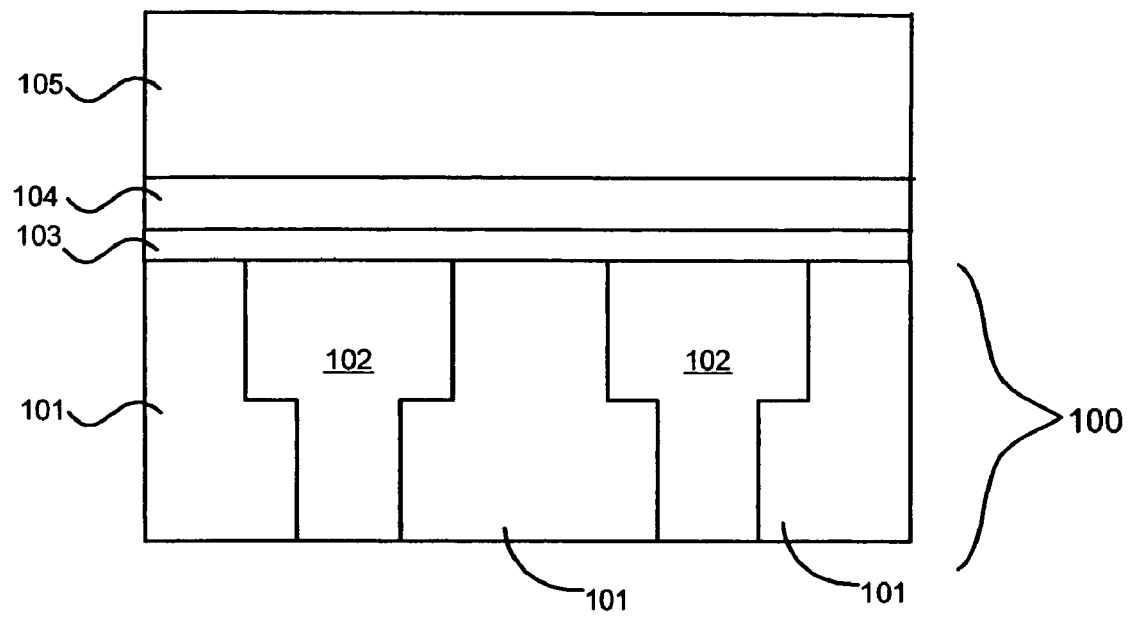

In FIG. 1C, a sacrificial layer 105 is deposited overlying support layer 104. Sacrificial layer 105 is used to define the subsequently formed floating metal structure, and is advantageously of a material preferentially etched by a noble gas fluoride. For example, sacrificial layer 105 may be of a silicon material such as polycrystalline silicon or amorphous silicon. The silicon material may be etched using a noble gas fluoride such as xenon difluoride ($XeF_2$). A sacrificial layer 105 of polycrystalline silicon may be deposited by PECVD or physical vapor deposition (PVD) to a thickness of 5000 Angstroms, for example.

Figure 1D:
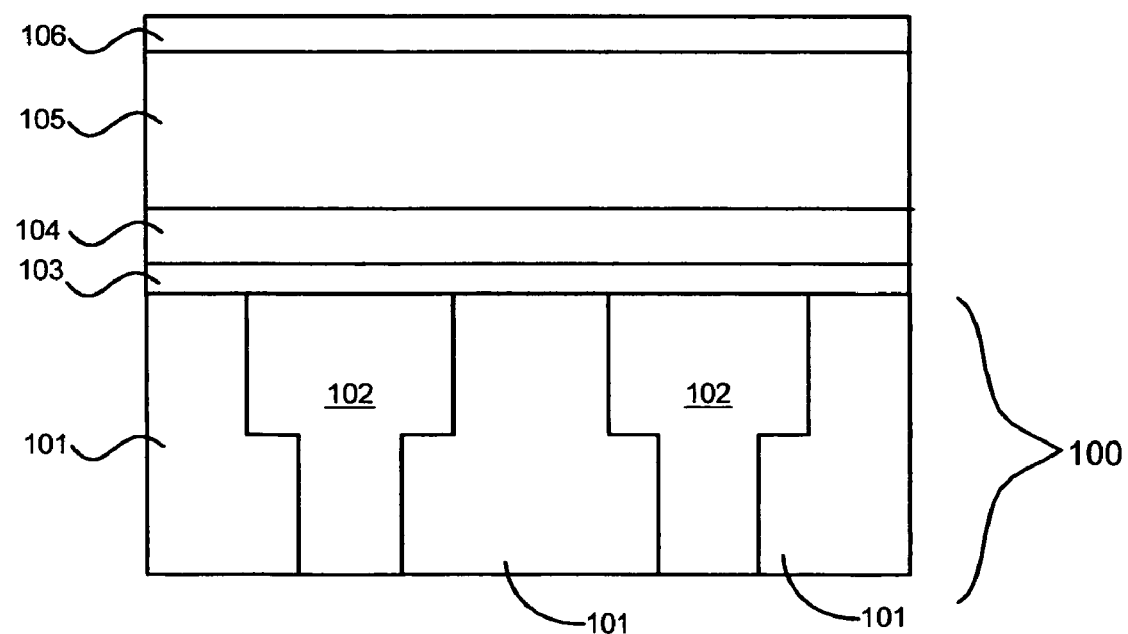

In FIG. 1D, a non-conductive layer 106 is optionally deposited overlying sacrificial layer 105. Non-conductive layer 106 provides additional structural support to the subsequently formed floating metal structure, and may not be needed in some applications. Non-conductive layer 106 may be a silicon nitride layer deposited by PECVD to a thickness of 500 Angstroms, for example. Other non-conductive materials may also be used instead of silicon nitride. For example, silicon dioxide or silicon carbide may also be used as a non-conductive layer 106.

Figure 1E:
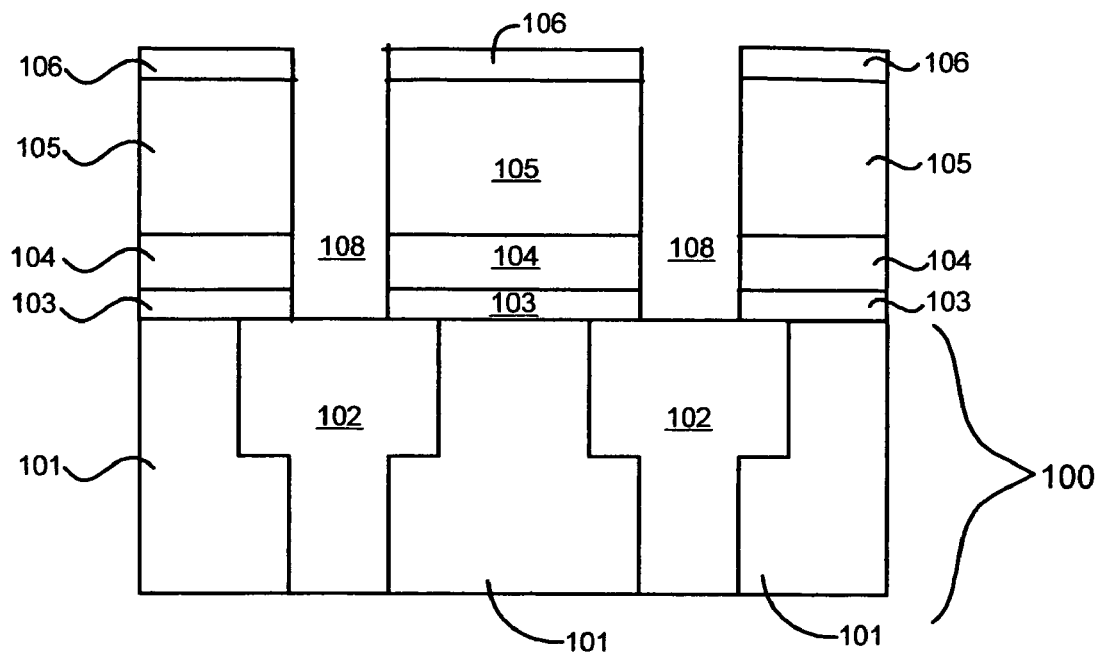
Figure 1F:
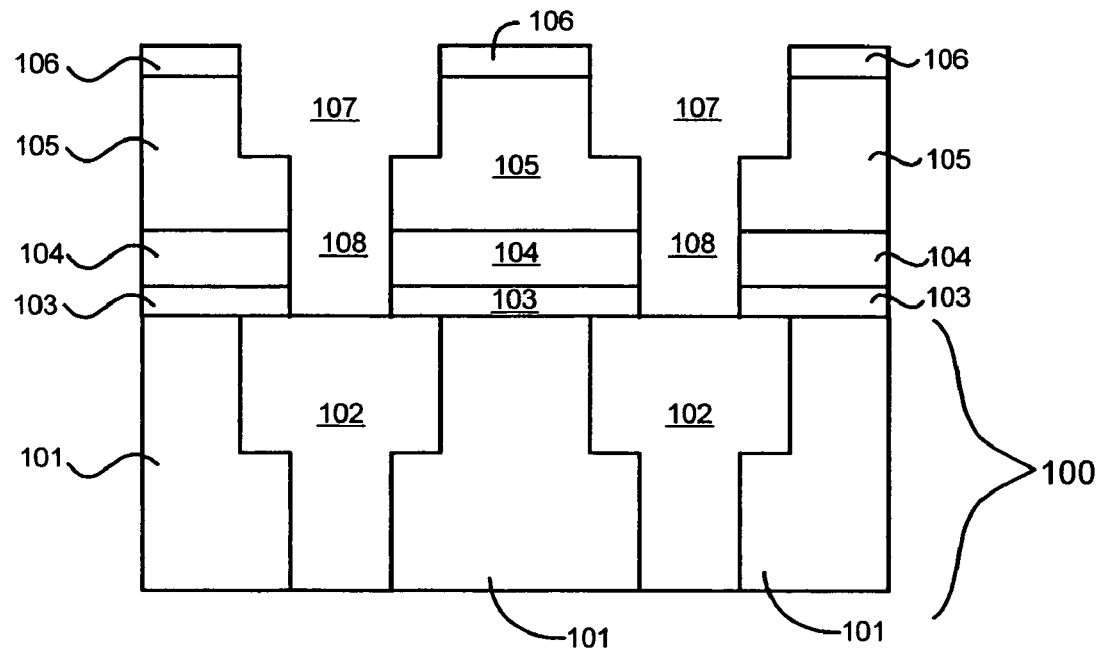

In FIGS. 1E and 1F, a dual-damascene etch process is performed on the sample of FIG. 1D to form vias 108 and interconnect line patterns 107. Any type of dual-damascene etch process may be used to form vias 108 and interconnect line patterns 107 without detracting from the merits of the present invention. For example, either a "via first" or a "line first" dual-damascene etch process may be employed to form vias 108 and interconnect line patterns 107.

The following example illustrates a line first dual-damascene etch process. Referring to FIG. 1E, vias 108 are formed by etching through layers 106, 105, 104, and 103. Thereafter, as shown in FIG. 1F, interconnect line patterns 107 are formed by etching layers 106 and 105.

Figure 1G:
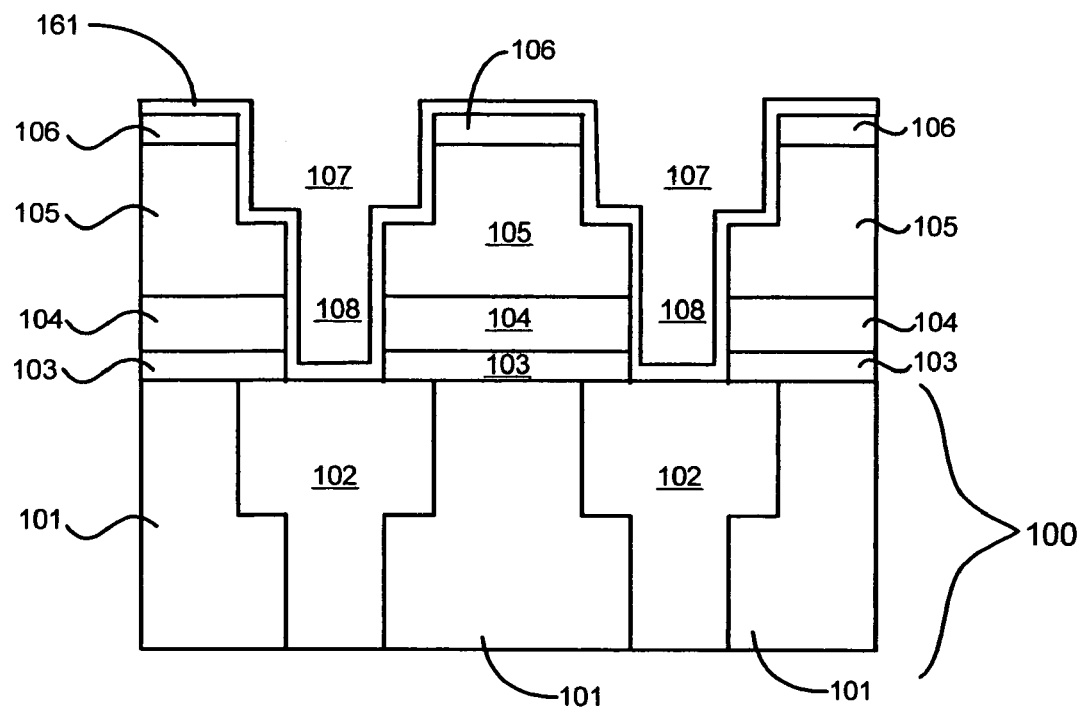

In FIG. 1G, a barrier layer 161 is deposited on the sample of FIG. 1F prior to depositing a metal in interconnect line patterns 107 and vias 108. For example, a barrier layer 161 of tantalum/tantalum nitride may be deposited by PVD.

Figure 1H:
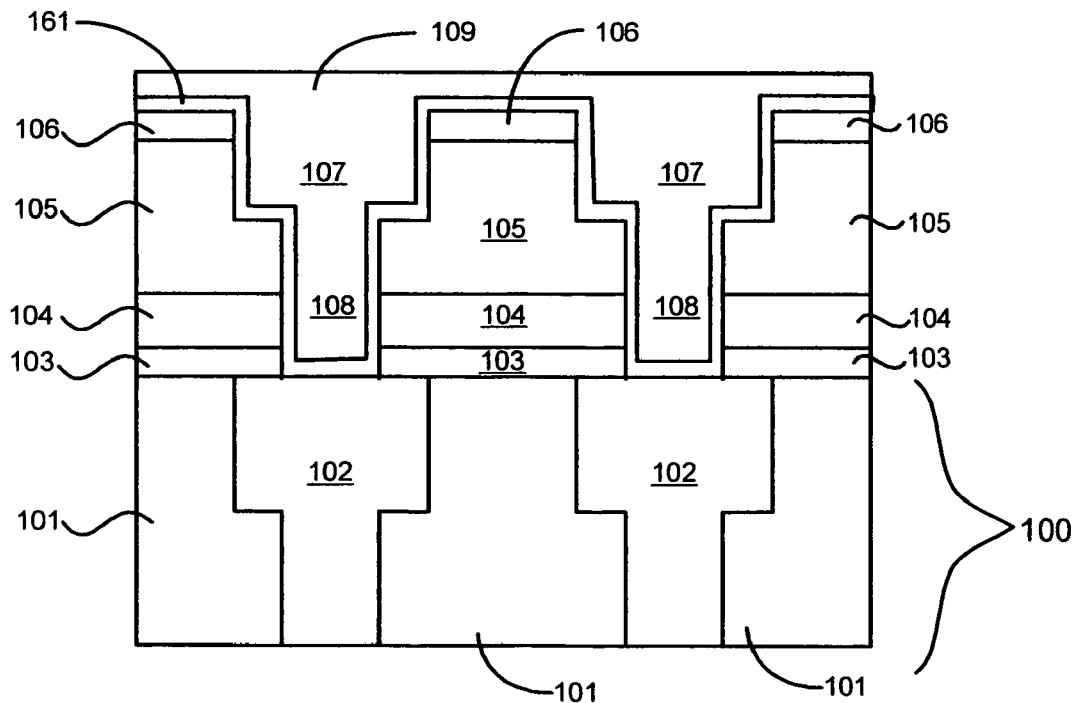

In FIG. 1H, a metal 109 is deposited in vias 108 and interconnect line patterns 107. Metal 109 fills vias 108 to from via connections to metallization level 100, and fills interconnect line patterns 107 to form interconnect lines coupled to metal structures 102. A metal 109 of copper may be deposited by first depositing a copper seed layer, followed by a bulk copper electroplating step. (The seed layer is not depicted for clarity.)

Figure 1I:
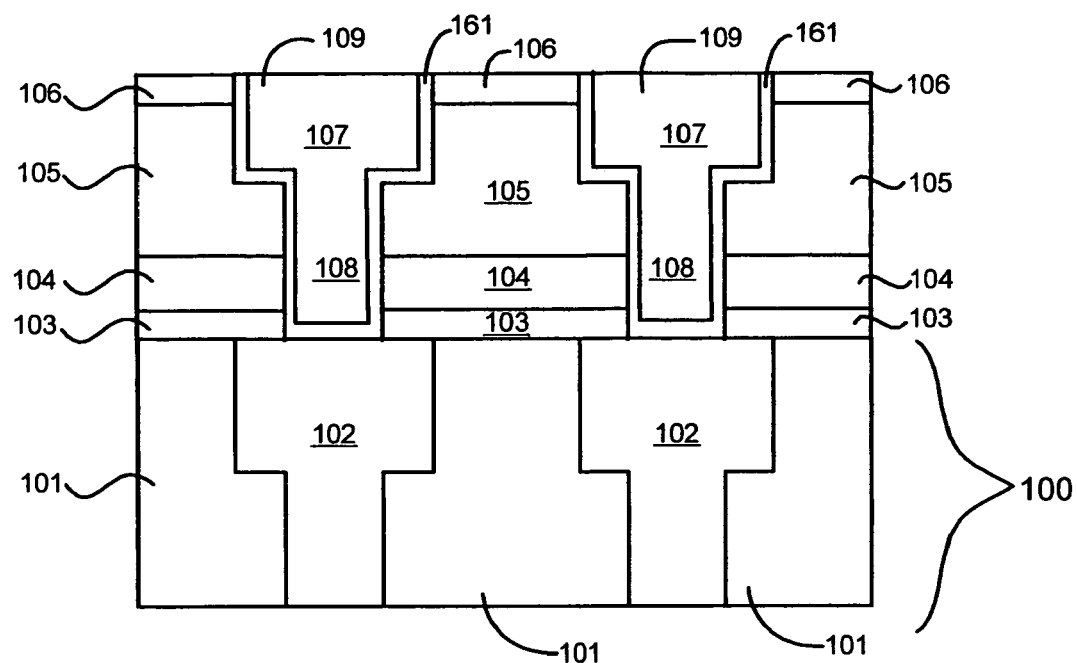

In FIG. 1I, metal 109 is planarized. For example, a metal 109 of copper may be planarized by chemical-mechanical polishing (CMP).

Figure 1J:
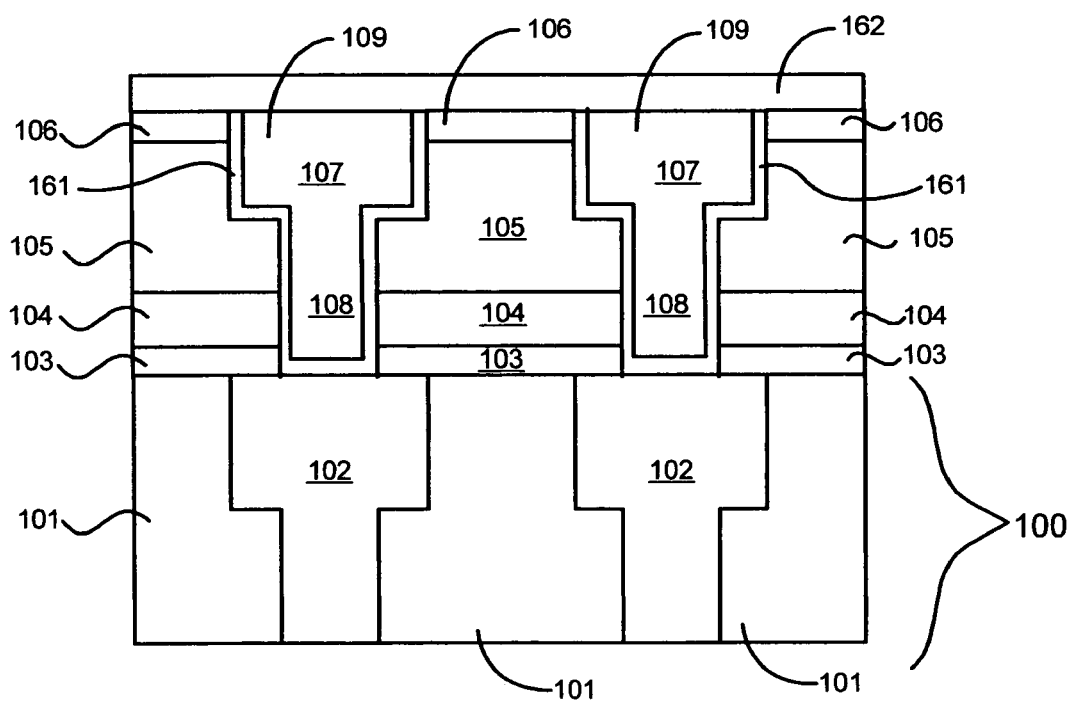

In FIG. 1J, a capping layer 162 is deposited on the sample of FIG. 1I. Capping layer 162 helps minimize copper migration and provides structural support in applications where additional levels will be formed over the subsequently formed floating metal structure. Capping layer 162 may be a silicon nitride layer deposited to a thickness of 500 Angtroms by PECVD, for example. Other materials may also be used as a capping layer 162 including silicon carbide.

Figure 1K:
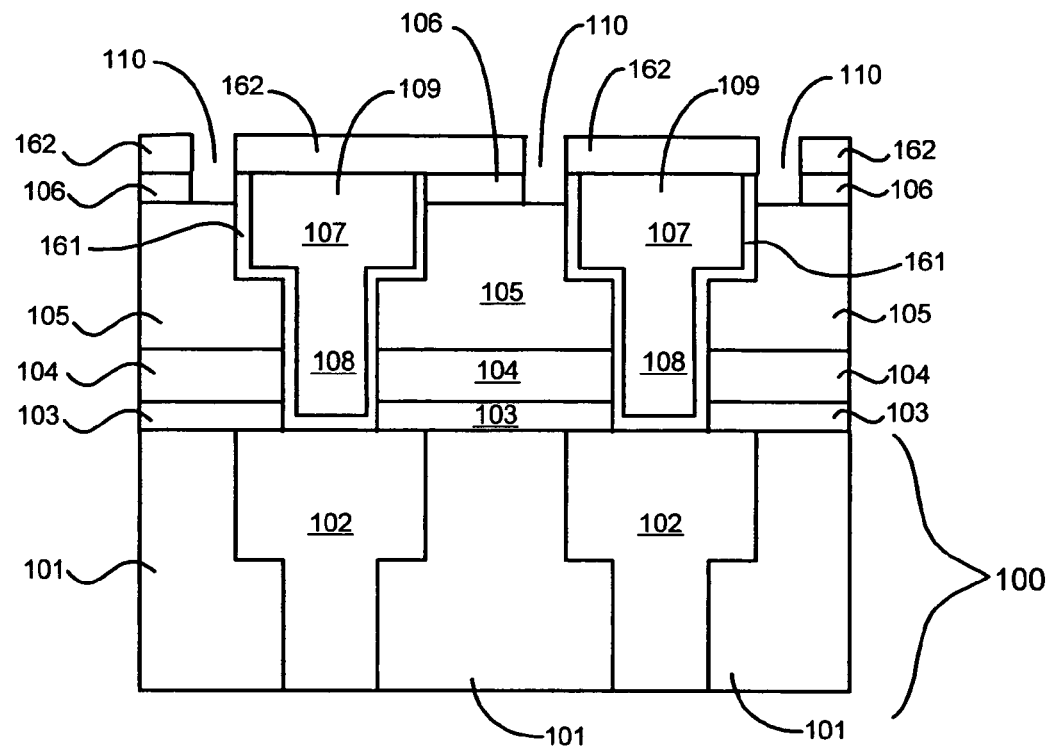

In FIG. 1K, capping layer 162 and non-conductive layer 106 are etched to form windows 110. Windows 110 expose the underlying sacrificial layer 105.

Prior to a subsequent step of etching sacrificial layer 105, native oxide on the surface of sacrificial layer 105 may have to be removed. For example, a sacrificial layer 105 of polycrystalline silicon may have native oxide thereon. In that case, the sample of FIG. 1K is first dipped in a pre-etch solution of ethylene glycol and ammonium fluoride prior to etching sacrificial layer 105. A suitable commercially available pre-etch solution includes that of the type available from ACSI, Inc. of Milpitas, Calif. under the name NOE Etch I™ solution.

Figure 1L:
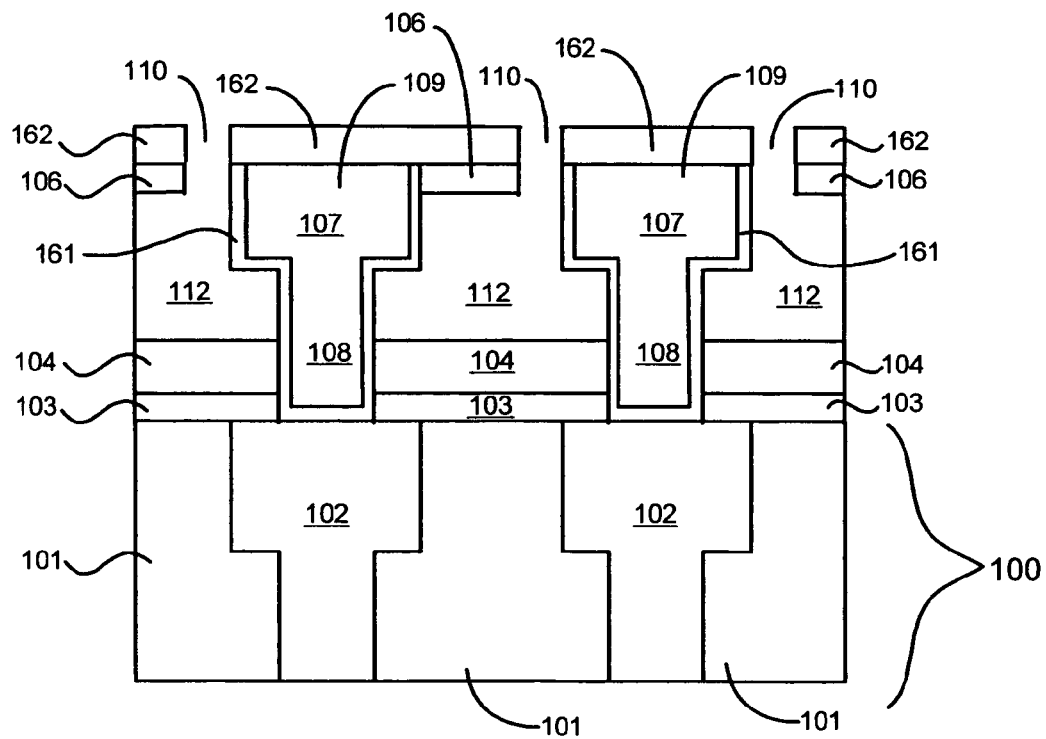

In FIG. 1L, the sample of FIG. 1K is placed in an environment including a noble gas fluoride to etch sacrificial layer 105. For example, the sample of FIG. 1K may be placed in a vacuum chamber (not shown) where a noble gas fluoride is introduced. The sample is left in the chamber for a time sufficient to etch most of the remaining sacrificial layer 105 and form air cores 112 (e.g., 2 to 5 minutes; chamber pressure of $50 \times 10^{-3}$ Torr). The process parameters for etching sacrificial layer 105 using a noble gas fluoride depend on the chamber used, the physical details of the sample, etc.

Preferably, the noble gas fluoride includes xenon difluoride. Other noble gas fluorides that may be used include those of krypton and argon. Xenon difluoride has been used as an etchant in micro-electro-mechanical systems (MEMS) applications. For example, U.S. Pat. No. 5,726,480 issued to Pister discloses the use of xenon difluoride in the fabrication of MEMS structures. U.S. application Ser. No. 09/952,626, entitled "MICROELECTRONIC MECHANICAL SYSTEM AND METHODS", filed by Mike Bruner on Sep. 13, 2001, also discloses the use of xenon difluoride as an etchant. The aforementioned disclosures by Pister and Bruner are incorporated herein by reference in their entirety.

It is to be noted that unlike a MEMS structure which employs metals primarily for mechanical functions, an integrated circuit employs metals primarily to carry electrical signals. Reducing the capacitance on a metal line, while of minimal concern to the fabrication of MEMS structures, is important in integrated circuit applications.

Still referring to FIG. 1L, the step of etching sacrificial layer 105 using a noble gas fluoride results in air cores 112 surrounding metal 109. Each metal 109 is now a "floating" metal structure in that an air-filled space (i.e., an air core 112) surrounds it. An air core 112 is a unity-k dielectric region because air has a dielectric constant approximately equal to 1. Thus, air cores 112 lower the capacitance on metals 109 and help increase signal propagation speeds. As can be appreciated, a method of forming a floating metal structure in accordance with an embodiment of the present invention allows for the creation of a unity-k dielectric region without having to employ complex structural systems.

Figure 1M:
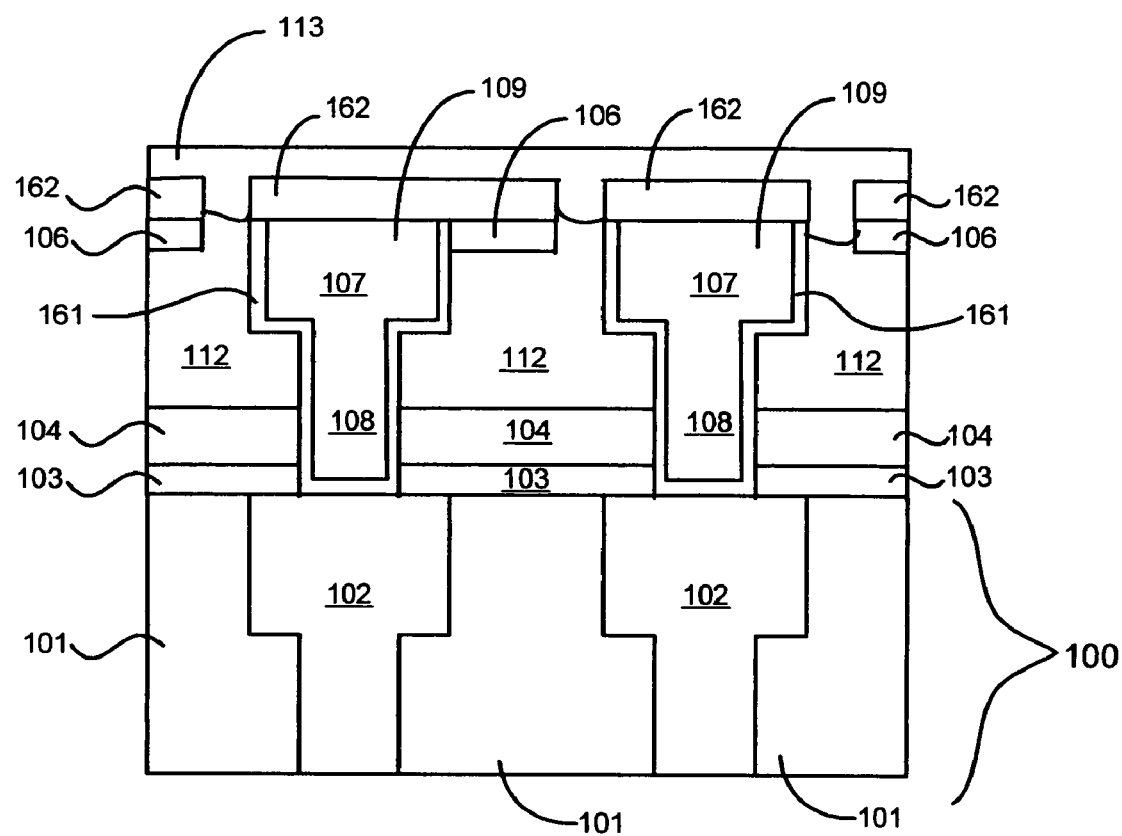

Continuing with FIG. 1M, a topside layer 113 is deposited on the sample of FIG. 1L. Topside layer 113 provides a base on which overlying metallization levels may be formed. Topside layer 113 may be a silicon nitride layer deposited by PECVD to a thickness of 500 Angstroms if it is a middle layer or 9000 Angstroms if it is the last layer, for example. Topside layer 113 may also be of other non-conductive material including oxynitride.

Figure 2:
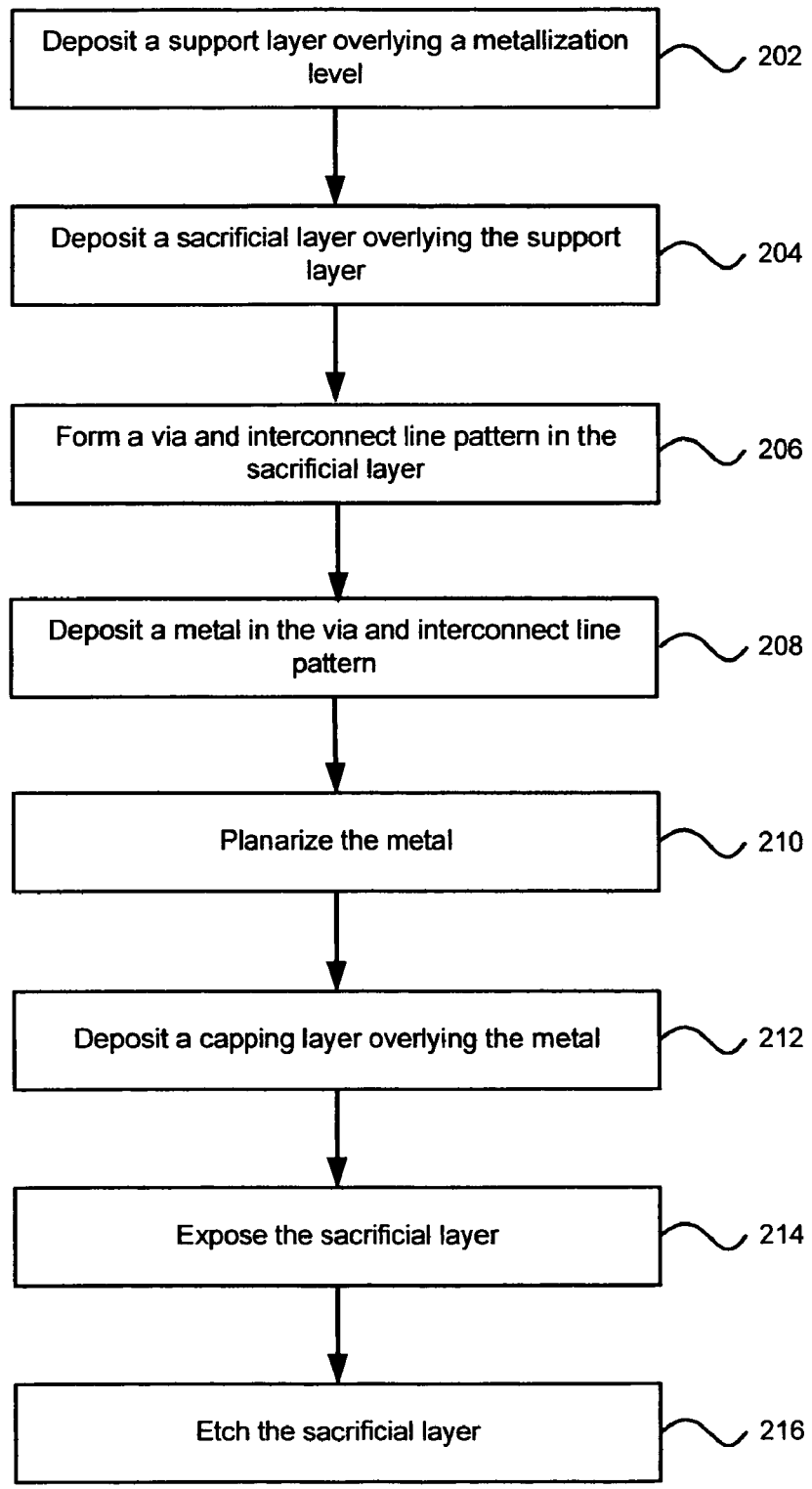
FIG. 2 shows a flow diagram of a method of forming a floating metal structure in a dual-damascene process in accordance with an embodiment of the present invention.

Referring now to FIG. 2, there is shown a flow diagram of a method of forming a floating metal structure in a dual-damascene process according to an embodiment of the present invention. In step 202, a support layer is deposited overlying a metallization level. The support layer, which may be of silicon dioxide, provides structural support to a subsequently formed floating metal structure.

In step 204, a sacrificial layer is deposited overlying the support layer. The sacrificial layer defines the subsequently formed floating metal structure. The sacrificial layer may be a silicon material such as polycrystalline silicon or amorphous silicon. Optionally, a non-conductive layer such as silicon nitride is deposited overlying the sacrificial layer to provide additional structural support to the floating metal structure.

In step 206, a via and an interconnect line pattern are formed in the sacrificial layer. The via and the interconnect line pattern may be formed using a dual-damascene etch process.

In step 208, a metal is deposited in the via and the interconnect line pattern. This results in an interconnect line coupled to a metal line in a lower metallization level.

In step 210, the metal is planarized.

In step 212, a capping layer is deposited overlying the metal. The capping layer helps minimize copper migration and provides structural support in applications where additional levels will be formed over the subsequently formed floating metal structure.

In step 214, a window is formed at least through the capping layer (and any other layers between the capping layer and the sacrificial layer) to expose the sacrificial layer. Native oxide on the exposed surface of the sacrificial layer may have to be removed prior to the subsequent etching of the sacrificial layer.

In step 216, the sacrificial layer is etched using a chemistry that includes a noble gas fluoride. For example, a sacrificial layer of polycrystalline silicon may be etched using a chemistry that includes xenon difluoride. This etching step "floats" the metal by creating an air core surrounding the metal. The air core provides a unity-k dielectric region that lowers the resulting capacitance on the metal.

An improved dual-damascene process and associated floating metal structures have been disclosed. While specific embodiments have been provided, it is to be understood that these embodiments are for illustration purposes and not limiting. Many additional embodiments will be apparent to persons of ordinary skill in the art reading this disclosure. Thus, the present invention is limited only by the following claims.

What is claimed is:

1. A method of forming an interconnect line in an integrated circuit, the method comprising:
    depositing a capping layer over a metallization level;
    depositing a support layer over the capping layer, the support layer being configured to provide structural support to a subsequently formed first interconnect line after an air core is formed over the metallization level;
    depositing a sacrificial layer over the support layer;
    forming an opening through the sacrificial layer, the support layer, and the capping layer;
    depositing a metal in the opening, the metal serving as the first interconnect line and a via connection to a second interconnect line in the metallization level; and
    etching the sacrificial layer using a chemistry that includes a noble gas fluoride to create the air core over the metallization level.

2. The method of claim 1 further comprising the act of planarizing the metal prior to etching the sacrificial layer.

3. The method of claim 1 further comprising the act of depositing a topside layer over the metal after etching of the sacrificial layer.

4. The method of claim 1 wherein the opening includes a via.

5. The method of claim 1 wherein the metal includes copper.

6. The method of claim 1 wherein the noble gas fluoride includes xenon difluoride.

7. The method of claim 1 wherein the sacrificial layer includes polycrystalline silicon.

8. The method of claim 1 wherein the capping layer includes silicon nitride.

9. The method of claim 1 wherein the metallization level includes a damascene structure.

10. A method of forming a metal structure in a dual-damascene process for fabricating an integrated circuit, the method comprising:
    depositing a support layer over a first metallization level of the integrated circuit, the support layer being configured to provide structural support to a subsequently formed interconnect line in a second metallization level after an air core is formed over the first metallization level;
    depositing a sacrificial layer over the support layer;
    forming a via and an interconnect line pattern in the sacrificial layer;
    depositing a metal in the via and in the interconnect line pattern, the metal serving as a metal layer of the second metallization level and forming a via connection to the first metallization level;
    planarizing the metal; and
    etching the sacrificial layer using a noble gas fluoride etchant to form the air core between the first metallization level and the second metallization level.

11. The method of claim 10 wherein the sacrificial layer comprises polycrystalline silicon.

12. The method of claim 10 wherein the metal comprises copper.

13. The method of claim 10 wherein the noble gas fluoride comprises xenon difluoride.

14. The method of claim 10 further comprising:
    prior to etching the sacrificial layer, depositing a capping layer over the metal.

15. The method of claim 10 further comprising:
    depositing a non-conductive layer over the sacrificial layer before depositing the metal in the via and in the interconnect line pattern;
    wherein the via extends through the non-conductive layer, the sacrificial layer, and the support layer.

16. The method of claim 15 wherein the support layer is over a capping layer and wherein the via extends through the non-conductive layer, the sacrificial layer, the support layer, and the capping layer.

* * * * *